United States Patent
Marinaro et al.

(10) Patent No.: US 6,170,494 B1
(45) Date of Patent: Jan. 9, 2001

(54) METHOD FOR AUTOMATICALLY CLEANING RESIST NOZZLE

(75) Inventors: Vincent L. Marinaro, Sunnyvale; Eric Kent, San Jose; Ted Wakamiya, San Ramon, all of CA (US)

(73) Assignee: Advanced Micro Devices, Inc., Sunnyvale, CA (US)

( * ) Notice: Under 35 U.S.C. 154(b), the term of this patent shall be extended for 0 days.

(21) Appl. No.: 09/510,411

(22) Filed: Feb. 22, 2000

Related U.S. Application Data

(60) Provisional application No. 60/165,069, filed on Nov. 12, 1999.

(51) Int. Cl.[7] .................................................. B08B 3/02
(52) U.S. Cl. ................. 134/22.18; 134/22.1; 134/22.11; 134/22.14; 134/22.19; 134/25.4; 134/42; 134/170; 134/171; 134/198; 134/199; 134/166 R; 134/169 R; 422/99; 422/100
(58) Field of Search ..................... 134/170, 171, 134/198, 199, 166 R, 169 R, 22.1, 22.11, 22.14, 22.18, 22.19, 25.4, 42; 422/99, 100

(56) References Cited

U.S. PATENT DOCUMENTS

| | | | |
|---|---|---|---|
| 2,827,063 | * | 3/1958 | Roy ........................................ 134/171 |
| 4,730,631 | * | 3/1988 | Schwartz ............................... 134/155 |
| 4,820,497 | * | 4/1989 | Howell .................................... 422/63 |
| 4,923,522 | * | 5/1990 | Sowers ................................. 134/22.1 |
| 4,977,911 | * | 12/1990 | Vetter ...................................... 134/34 |
| 5,405,087 | * | 4/1995 | Waryu et al. ......................... 239/288 |
| 5,658,615 | * | 8/1997 | Hasebe et al. ........................ 427/240 |
| 5,718,763 | * | 2/1998 | Tateyama et al. ..................... 118/52 |
| 5,814,158 | * | 9/1998 | Hollander et al. ........................ 134/3 |
| 5,827,744 | * | 10/1998 | Fose et al. .............................. 436/49 |
| 5,941,456 | * | 8/1999 | Waryu et al. ......................... 239/112 |
| 5,964,257 | * | 10/1999 | Lin et al. .............................. 134/170 |
| 5,966,635 | * | 10/1999 | Hiatt et al. ............................ 438/905 |
| 6,015,467 | * | 1/2000 | Nagasawa et al. ....................... 134/1 |

\* cited by examiner

*Primary Examiner*—Sharidan Carrillo
(74) *Attorney, Agent, or Firm*—Foley & Lardner

(57) ABSTRACT

A storage apparatus for photoresist dispensing nozzles has solvent inlets positioned directly opposite the nozzles when the nozzles are in their home positions. Photoresist cleaning solvent is introduced through these inlets at periodic intervals and directly applied on the nozzles to keep them clean.

4 Claims, 2 Drawing Sheets

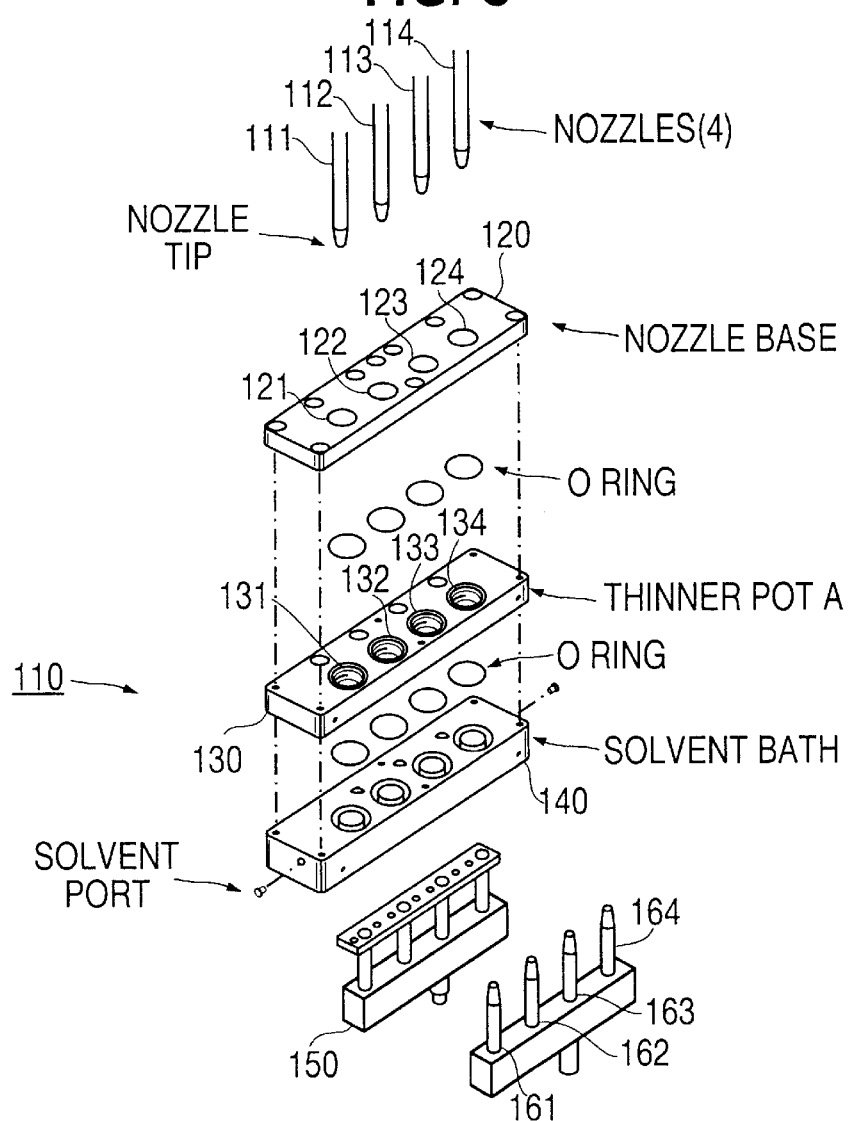
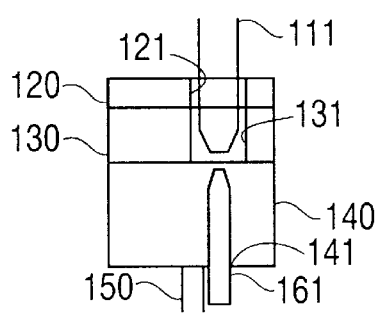

METHOD FOR AUTOMATICALLY CLEANING RESIST NOZZLE

REFERENCE TO PROVISIONAL APPLICATION

This application claims the benefit of U.S. Provisional Application Ser. No. 60/165,069, filed Nov. 12, 1999.

BACKGROUND OF THE INVENTION

1. Field of the Invention

The invention relates generally to a cleaning apparatus for nozzles used in semiconductor processes and, more particularly, to a cleaning apparatus for photoresist dispensing nozzles, the cleaning apparatus having a cleaning solvent inlet that is positioned and configured to squirt the cleaning solvent directly onto the photoresist dispensing nozzles.

2. Description of the Related Art

Photoresist used during photolithography is dispensed onto semiconductor wafers using a plurality of nozzles. When these nozzles are not being used, they are returned to their home positions. The home positions of the nozzles correspond to their storage locations in a cleaning apparatus.

A conventional cleaning apparatus 10 in which the nozzles are stored is illustrated in FIG. 1 as an exploded view. The cleaning apparatus 10 includes a nozzle base 20, a thinner pot 30, a solvent bath or catch pan 40, and a drain 50. Each of these components has openings corresponding to four photoresist dispensing nozzles 11, 12, 13, 14.

In their home positions, the photoresist dispensing nozzles 11–14 are inserted into corresponding openings 21, 22, 23, 24 of the nozzle base 20. The tips of the nozzles, when inserted, extend into corresponding openings 31, 32, 33, 34 of the thinner pot 30, near the bottom of the thinner pot 30, as shown in FIG. 2, which shows a side cross-sectional view of the conventional cleaning apparatus 10.

While the nozzles are in their home position, photoresist that remains in the nozzles dries up and begins to clog them up, especially at the tip and when the nozzles sit idle for any length of time. When any one of such nozzles is used to dispense photoresist during the photolithography process, dried photoresist particles become dispensed onto the semiconductor wafer and leads to defects. In some cases, little or no photoresist is dispensed due to clogging.

Three different techniques have been used to combat this problem. First, maintenance technicians remove the nozzles and manually clean each nozzle with a photoresist cleaning solvent. Second, the nozzles undergo a dummy dispense procedure. In this procedure, the photoresist is dispensed through the nozzles while they are in their home positions. This procedure keeps the nozzle tips continuously wet in an effort to prevent the photoresist remaining at the nozzle tips from drying up. The dispensed photoresist is dumped through the drain 50. Third, photoresist cleaning solvent is introduced through an inlet 60. The cleaning solvent that is introduced floods the solvent catch pan 40 but does not come in contact with the nozzles. At best, the nozzles are moistened from the solvent vapors, but this is not sufficient to prevent the nozzle from clogging.

SUMMARY OF THE INVENTION

The invention provides a cleaning apparatus for photoresist dispensing nozzles which has one or more solvent needles positioned to oppose corresponding nozzle or nozzles that are stored in their home positions so that, as photoresist cleaning solvent is introduced through the needles, the photoresist cleaning solvent is squirted directly at the nozzles to clean the nozzles and keep them from clogging. The squirting of the photoresist cleaning solvent through the needles preferably occurs at a specified interval to prevent the photoresist remaining in the nozzles from drying up.

Additional objects, features and advantages of the invention will be set forth in the description of preferred embodiments which follows.

BRIEF DESCRIPTION OF THE DRAWINGS

The invention is described in detail herein with reference to the drawings in which:

FIG. 3 is an exploded view of a cleaning apparatus for photoresist dispensing nozzles according to an embodiment of the invention; and FIG. 4 is a side cross-sectional view of a cleaning apparatus for photoresist dispensing nozzles according to an embodiment of the invention.

Figure 1:
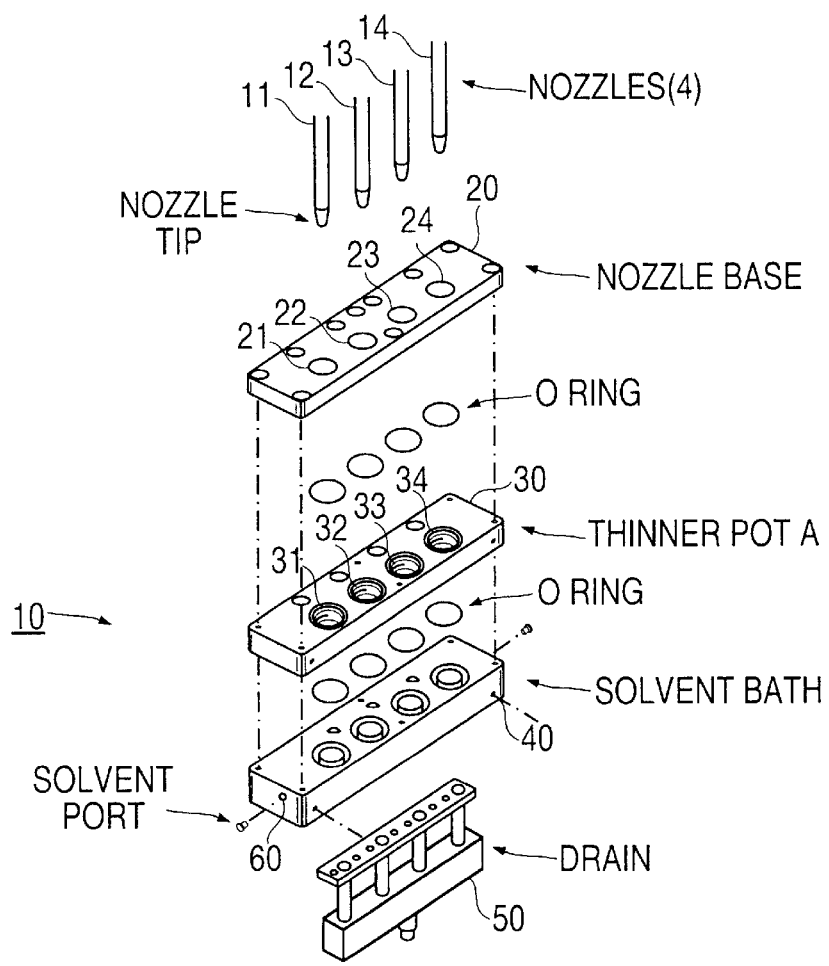
FIG. 1 is an exploded view of a conventional cleaning apparatus for photoresist dispensing nozzles.
Figure 2:
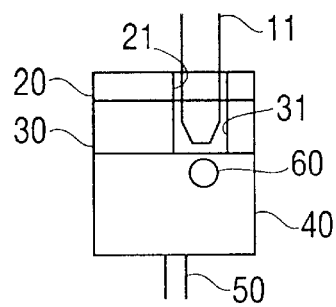
FIG. 2 is a side cross-sectional view of a conventional cleaning apparatus for photoresist dispensing nozzles.

The accompanying drawings, which are incorporated in and constitute a part of the specification, illustrate presently preferred exemplary embodiments of the invention, and, together with the general description given above and the detailed description of the preferred embodiments given below, serve to explain the principles of the invention.

DETAILED DESCRIPTION OF THE PREFERRED EMBODIMENTS

FIG. 3 illustrates a cleaning apparatus 110 according to an embodiment of the invention. The cleaning apparatus 110 includes a nozzle base 120, a thinner pot 130, a solvent bath or catch pan 140, and a drain 150. Each of these components has openings corresponding to four photoresist dispensing nozzles 111, 112, 113, 114.

In their home positions, the photoresist dispensing nozzles 111–114 are inserted into corresponding openings 121, 122, 123, 124 of the nozzle base 120. The tips of the nozzles, when inserted, extend into corresponding openings 131, 132, 133, 134 of the thinner pot 130, near the bottom of the thinner pot 130, as shown in FIG. 4, which shows a side cross-sectional view of the cleaning apparatus 110.

When the nozzles 111–114 are stored in their home positions, the nozzle tips may become clogged up with dried up photoresist particles. To clean the nozzles 111–114, solvent needles 161, 162, 163, 164 are provided underneath the tip of each nozzle 111–114. The solvent needles 161–164 are inserted into corresponding openings at the bottom of the solvent catch pan 140.

FIG. 4 shows the solvent needle 161 inserted into the opening 141 at the bottom of the solvent catch pan 140. The solvent needle 161 extends sufficiently far into the solvent catch pan 140 so that photoresist cleaning solvent, for example PGMEA (propylene glycol mono methyl ether acetate), introduced therethrough comes in direct contact with the tip of the nozzle 111. Preferably, the size of the solvent needle opening is selected so that the photoresist cleaning solvent forms a spray as it exits the opening and the spray comes in direct contact with the tips of the nozzle 111 to clean it and to prevent it from clogging up. The excess photoresist cleaning solvent and the dissolved photoresist are collected by the solvent catch pan 140 and discharged through the drain 150. The other solvent needles 162–164 are inserted into their corresponding openings and operated in a like manner.

Other methods of producing the solvent spray may be used. For example, in place of the needles 161–164, the photoresist cleaning solvent may be introduced through spray nozzles or other openings through which an increased flow rate can be achieved. Further, the spraying or squirting of the photoresist cleaning solvent preferably occurs at a specified interval to prevent the photoresist remaining in the nozzles from drying up.

While particular embodiments according to the invention have been illustrated and described above, it will be clear that the invention can take a variety of forms and embodiments within the scope of the appended claims.

We claim:

1. A method of cleaning a photoresist dispensing nozzle, said method comprising the steps of:
   a) providing a photoresist dispensing nozzle having a tip, said tip being clogged with dried up photoresist particles;
   b) positioning the tip of the photoresist dispensing nozzle in a nozzle base;
   c) providing a catch pan having an opening;
   d) positioning the catch pan beneath said nozzle base such that said opening of said catch pan faces said tip of said photoresist dispensing nozzle;
   e) providing a solvent dispensing needle having an opening;
   f) inserting said solvent dispensing needle through said opening of said catch pan such that said opening of said solvent dispensing needle faces said tip of said photoresist dispensing nozzle;
   g) spraying photoresist cleaning solvent upwardly through said opening of said solvent dispensing needle directly onto said tip of said photoresist dispensing nozzle and dissolving the dried up photoresist particles while said tip of said photoresist dispensing nozzle is stored in said nozzle base;
   h) collecting the photoresist cleaning solvent and the dissolved photoresist particles in said catch pan; and
   i) draining the photoresist cleaning solvent and the dissolved photoresist particles from said catch pan.

2. The method according to claim 1, further comprising the step of repeating the steps of spraying and draining at periodic intervals.

3. The method according to claim 1, wherein the step of spraying includes the step of simultaneously spraying the photoresist cleaning solvent directly onto a plurality of tips of photoresist dispensing nozzles.

4. The method according to claim 1, wherein the photoresist cleaning solvent comprises propylene glycol mono methyl ether acetate.

* * * * *